US006794664B1

(12) United States Patent
Mitchell et al.

(10) Patent No.: US 6,794,664 B1
(45) Date of Patent: Sep. 21, 2004

(54) UMBILICAL CORD FACILITIES CONNECTION FOR AN ION BEAM IMPLANTER

(75) Inventors: Robert J. Mitchell, Winchester, MA (US); Kevin T. Ryan, Wilmington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/728,669

(22) Filed: Dec. 4, 2003

(51) Int. Cl.[7] .............................. H01J 37/08; G21G 5/00
(52) U.S. Cl. .............................. 250/492.21; 250/492.3; 250/492.2; 250/491.1
(58) Field of Search ........................ 250/492.21, 492.3, 250/492.2

(56) References Cited

U.S. PATENT DOCUMENTS

| | | |
|---|---|---|
| 4,293,137 A | 10/1981 | Ezekiel |
| 4,761,559 A | 8/1988 | Myron |
| 4,975,586 A | 12/1990 | Ray |
| 5,436,790 A | 7/1995 | Blake et al. |
| 5,444,597 A | 8/1995 | Blake et al. |
| 6,414,328 B1 * | 7/2002 | Nussupov ............... 250/492.21 |
| 6,580,082 B1 * | 6/2003 | Mitchell .................. 250/492.2 |
| 6,689,221 B2 * | 2/2004 | Ryding et al. ............. 118/730 |
| 6,740,894 B1 * | 5/2004 | Mitchell ................. 250/492.21 |

\* cited by examiner

Primary Examiner—John R. Lee
Assistant Examiner—Kalimah Fernandez
(74) Attorney, Agent, or Firm—Watts, Hoffmann Co., LPA (57) ABSTRACT

An ion beam implanter includes an ion beam source for generating an ion beam moving along a beam line and a vacuum implantation chamber wherein a workpiece is positioned to intersect the ion beam for ion implantation of a surface of the workpiece by the ion beam. The ion beam implanter further includes a workpiece support structure coupled to the implantation chamber and supporting the workpiece. The workpiece support structure includes a chuck including a rotatable pedestal for supporting the workpiece. The workpiece support structure further includes a first rotatable reel coupled to and rotatable with the pedestal and a flexible, hollow cord carrying facilities such as coolant lines and electrical power conductors coupled to the rotatable reel such that, as the pedestal is rotated in a first direction, a length of the flexible cord that is wrapped around the first reel increases and, as the pedestal is rotated in an opposite direction, a length of the flexible cord that is wrapped around the first reel decreases.

33 Claims, 8 Drawing Sheets

UMBILICAL CORD FACILITIES CONNECTION FOR AN ION BEAM IMPLANTER

FIELD OF THE INVENTION

The present invention relates to a workpiece support structure for an ion beam implanter and, more particularly, to a workpiece support structure for an ion beam implanter including a hollow umbilical cord for routing coolant and electrical power between a rotatable workpiece support or pedestal of an electrostatic clamp within an evacuated implantation chamber and an exterior of the implanter at atmospheric pressure.

BACKGROUND ART

Ion beam implanters are widely used in the process of doping semiconductor wafers. An ion beam implanter generates an ion beam comprised of desired species of positively charged ions. The ion beam impinges upon an exposed surface of a workpiece such as a semiconductor wafer, substrate or flat panel, thereby "doping" or implanting the workpiece surface with desired ions. The pedestal can be tilted to adjust an implantation angle of the workpiece with respect to the ion beam striking the workpiece. An implantation angle of zero degrees (0°) means that the implantation surface of the workpiece is normal to the ion beam beam path. To minimize the detrimental effects of channeling small positive and negative implantation angles are often used for implantation.

Some ion implanters utilize serial implantation wherein one relatively large wafer workpiece is positioned on a workpiece support or pedestal of an electrostatic chuck in an evacuated implantation chamber and implanted or "doped" with desired ions. After implantation is completed, the workpiece is removed from the pedestal and another workpiece is positioned on the pedestal. In a quad implantation, a workpiece is subject to four implantations. Typically, after each of the four implantations the workpiece is rotated ninety degrees (90°).

The pedestal and electrostatic chuck are supported by a workpiece support structure extending into an evacuated implantation chamber. Specifically, the electrostatic chuck is supported on a scan arm. Certain facilities, including cooling fluid and gas and electrical power, must be routed to the electrostatic chuck pedestal through an interior region of the scan arm. The interior region of the scan arm is in communication with the outside environment and, therefore, is at atmospheric pressure. Since the pedestal rotates with respect to the scan arm, routing the facilities through the fixed scan arm to the rotating pedestal while maintaining a vacuum seal between the pedestal (at vacuum in the implantation chamber) and the scan arm interior region (at atmospheric pressure) is problematic.

One approach to providing for routing of the facilities to the pedestal while maintaining a vacuum seal between the pedestal and the scan arm interior region is to provide a slip ring and sliding seal assembly between the scan arm and the electrostatic chuck pedestal and route the facilities through the slip ring. However, such a slip ring and sliding seal assembly is bulky because of the "stack height" of the motor (which rotates the pedestal), the slip ring and the sliding seal. The "stack height" of such a slip ring/sliding seal assembly is relatively large whether the pedestal is driven by a direct drive motor affixed to the pedestal or the pedestal is driven by a motor and belt drive system wherein the motor is supported by the scan arm in a position offset from the pedestal. The slip ring/sliding seal assembly is also heavy and prone to leaking. Additionally, such assemblies often cause electrical breakdown or arcing and create excess drag to the mechanical drive system that rotates the pedestal.

What is desired is a workpiece support structure that provides for routing of facilities to the pedestal of an electrostatic chuck through an interior region of a scan arm supporting the electrostatic chuck that is less bulky, that is, has a shorter "stack height" than the combined stack height of the pedestal drive motor, slip ring and sliding seal of a slip ring/sliding seal assembly. What is also desired is a workpiece support structure that provides for routing of facilities to the pedestal of an electrostatic chuck through an interior region of a scan arm supporting the electrostatic chuck that is more durable than a slip ring/sliding seal assembly.

SUMMARY OF THE INVENTION

The present invention concerns an ion beam implanter having a workpiece support structure for supporting a workpiece within a vacuum or implantation chamber. The ion beam implanter includes an ion beam source for generating an ion beam moving along a path of travel and being scanned along an axis. A wafer workpiece is supported by the workpiece support structure in the implantation chamber such that the workpiece is positioned to intersect the path of travel of the scanned ion beam for implantation of an implantation surface of the workpiece by the ion beam.

In one preferred embodiment of the present invention, the workpiece support structure includes a workpiece holder assembly including a rotatable pedestal and an electrostatic clamp or chuck supporting the workpiece. The workpiece support structure further includes a drive system or assembly for rotating the pedestal and the workpiece coupled thereto. The drive assembly includes a drive motor, a drive pulley, a driven pulley and a drive belt extending between the drive and driven pulleys. The drive pulley is coupled to the drive motor, the driven pulley is coupled to the pedestal. When the drive motor rotates, the drive pulley is rotated causing the drive belt to rotate the driven pulley and thereby also rotate the pedestal.

The workpiece support structure further includes a first rotatable reel coupled to the drive pulley, a second rotatable reel coupled to and rotatable with the pedestal and a flexible, hollow, facilities-routing cable or cord extending between the first and second rotatable reels and partially wrapped around at least one of the first and second reels such that, as the pedestal is rotated in a first direction, a length of the flexible cord wrapped around the first reel increases and a length of the flexible cord wrapped around the second reel decreases and, as the pedestal is rotated in an opposite direction, a length of the flexible cord wrapped around the first reel decreases and a length of the flexible cord wrapped around the second reel increases.

Facilities including one or more water and gas coolant lines carrying coolant to the electrostatic clamp and one or more electrical power conductors conducting electrical power to the clamp are disposed within and routed through the cord. The coolant lines include a water feed and gas feed for gas cooling. Preferably, a first connector assembly is disposed near an end of the cord attached to the first reel, the first connector assembly providing for fixed connections for the coolant lines and electrical power conductors routed through the cord and a second connector assembly is disposed near an end of the cord attached to the second reel, the second connector assembly also providing for a fixed connections for the coolant lines and electrical power conductors.

The workpiece support structure preferably further includes a support or scan arm that supports the chuck, the scan arm defining an interior region at atmospheric pressure, the first and second rotatable reels, the cord and the drive and driven pulleys are disposed within the scan arm interior region. Advantageously, a hollow vacuum seal is disposed between the driven pulley and the pedestal to provide a seal between the ion implantation chamber interior region and the scan arm interior region, the vacuum seal defining a central opening through which a portion of the facilities are routed to the pedestal and electrostatic clamp.

The workpiece support structure of the present invention routes facilities (coolant and electrical power) through the hollow, facilities-routing cord and the use of a flat, hollow vacuum seal between the driven pulley and the pedestal. This arrangement provides for a highly durable routing of facilities from outside the implantation chamber (at atmospheric pressure) to the pedestal inside the implantation chamber (at vacuum) because of the durability of the flexible cord compared to a slip ring assembly, while at the same time advantageously minimizing "stack height" compared to motor plus a slip ring/sliding seal arrangement because the pedestal drive motor is offset from the pedestal-pulley vacuum seal and pedestal bearing assembly and a flat vacuum seal is used between the driven pulley and the pedestal. The workpiece support structure of the present invention also allows for a thinner scan arm and is better balanced because the pedestal drive motor is not positioned at the end of the scan arm where it would create additional torque forces on the scan arm. Yet another advantage of the workpiece support structure of the present invention is that it permits a stand-alone dosimetry system that monitors the ion beam to be positioned in dose proximity to the workpiece being implanted.

In a second preferred embodiment of the present invention, the workpiece support structure utilizes a single reel coupled to the pedestal. A hollow, facilities-routing cord, which routes facilities to the pedestal and the electrostatic chuck of the pedestal, is wound around the single reel, much like a clock spring. As the pedestal rotates in a first direction, the umbilical cord is unwrapped or played out from the reel, as the pedestal rotates in an opposite direction, the umbilical cord is wrapped or played onto the reel. As in the first preferred embodiment, a flat, hollow vacuum seal is disposed between the driven pulley and the pedestal. A driven pulley is coupled to the pedestal. A rotatable drive member is operatively connected to the driven pulley via a drive belt. As the rotatable drive member rotates, the driven pulley, umbilical cord reel and pedestal rotate in unison.

In a third preferred embodiment of the present invention, the workpiece support structure also utilizes a single reel coupled to the pedestal. The difference between the second and third embodiments is that a direct drive motor is coupled to the pedestal and the single reel obviating the need for a drive belt. As in the second preferred embodiment, a facilities-carrying, hollow cord is played onto and played out from the reel as the pedestal and reel are rotated in unison. A flat, hollow vacuum seal is disposed between reel and the pedestal. While in this embodiment, the direct drive motor positioned adjacent the pedestal does increase the stack height slightly and adds an additional torque force to a distal end of the scan arm, it simplifies the drive system by eliminating the need for a drive belt and driven pulley.

These and other objects, advantages, and features of the exemplary embodiment of the invention are described in detail in conjunction with the accompanying drawings.

DETAILED DESCRIPTION

Figure 1:
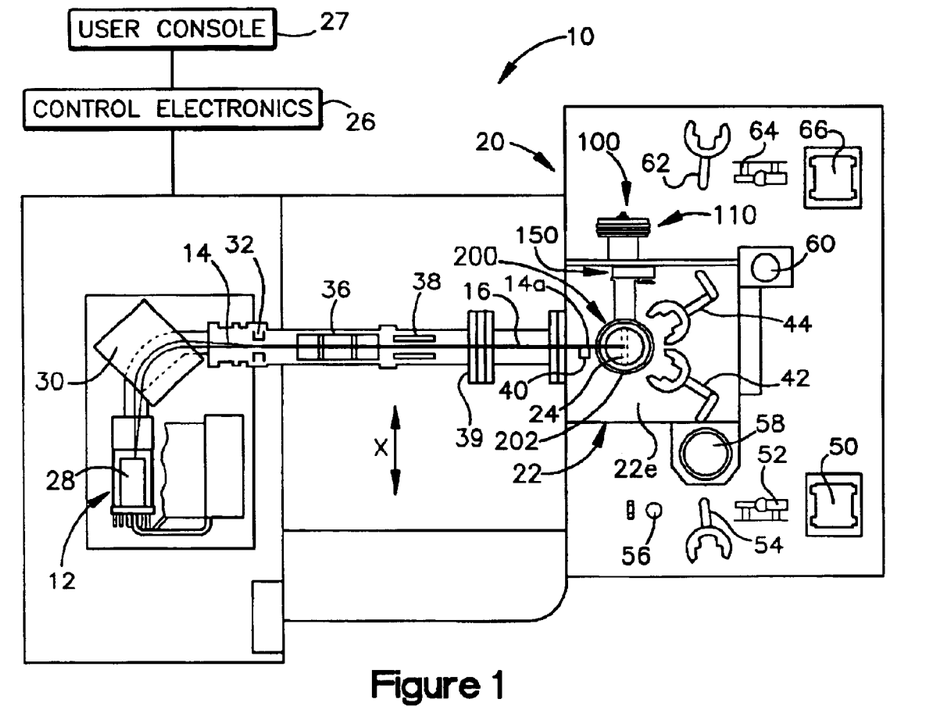
FIG. 1 is a schematic plan view of an ion beam implanter of the present invention.

Turning to the drawings, an ion beam implanter is shown generally at 10 in FIG. 1. The implanter includes an ion source 12 for creating ions that form an ion beam 14 which traverses a beam path 16 to an end or implantation station 20. The implantation station includes a vacuum or implantation chamber 22 defining an interior region 22e in which a workpiece 24 such as a semiconductor wafer or a flat panel or a substrate is positioned for implantation by the ion beam 14. Control electronics (shown schematically at 26) are provided for monitoring and controlling the ion dosage received by the workpiece 24. Operator input to the control electronics 26 are performed via a user control console 27.

The ion source 12 generates the ion beam 14 which impacts the workpiece 24. The ions in the ion beam 14 tend to diverge as the beam traverses a distance along the beam path 16 between the ion source 12 and the implantation chamber 22. The ion source 12 includes a plasma chamber 28 defining an interior region into which source materials are injected. The source materials may include an ionizable gas or vaporized source material.

Positioned along the beam path 16 is an analyzing magnet 30 which bends the ion beam 14 and directs it through a beam shutter 32. Subsequent to the beam shutter 32, the beam 14 passes through a quadrupole lens system 36 that focuses the beam 14. The beam path 16 extends through deflection, electrodes 38 wherein the ion beam 14 is repetitively deflected or scanned to generate a ribbon ion beam such that a portion of the ion beam 14 within the implantation chamber 22 is a ribbon ion beam 14a. The ribbon ion beam 14a enters the implantation chamber 22 through an opening 22a in a front wall 22b of the chamber 22. The ribbon ion beam 14a is an ion beam that essentially has the shape of a very narrow rectangle that is, a beam that extends in one direction, e.g., has a horizontal or "x" direction extent (shown as W in FIG. 2) with very limited extent in the orthogonal direction, e.g., in the vertical or "y" direction.

Generally, the extent of the ribbon ion beam 14a is sufficient to implant the entire implantation surface 25 of the workpiece 24, that is, if the ribbon ion beam 14a traversing the implantation chamber 22 extends in the horizontal or x direction (FIG. 1) and the workpiece 24 has a horizontal dimension of 300 mm. (or a diameter of 300 mm.). The control electronics 26 will appropriately energize the electrode 38 such that a horizontal extent, W, of the ribbon ion beam 14a, upon striking the implantation surface 24 of the workpiece 24 within the implantation chamber 22, will be at least 300 mm. The electrode 38 deflects the beam 14 and a parallelizing lens 39 is positioned along the beam line 16 to correct for the beam angle deflection caused by the electrode 38 such that the ribbon ion beam 14a is parallel when it implants the workpiece 24. The ion beam dosage is monitored by a stand alone dosimetry meter 40 positioned adjacent the ribbon ion beam 14a and in close proximity to the workpiece 24.

As will be explained below, a workpiece support structure 100 both supports and moves the workpiece 24 with respect to the ribbon ion beam 14 during implantation such that the entire implantation surface 25 of the workpiece 24 is uniformly implanted with ions. In addition to the scanning technique described above, those of skill in the art will recognize that the ribbon shape of the ribbon ion beam 14a within the implantation chamber 22 can be created in a number of ways. For example, an arc slit of the plasma chamber 28 may be shaped such that the ion beam as created has a ribbon shape from inception. The present invention is not limited to the use of any particular technique or structure to shape or form the ion beam.

A more detailed description of an ion implanter adapted for serial implantation of workpieces is disclosed in U.S. Pat. No. 4,975,586, issued to Ray et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference.

The implantation chamber interior region 22e is evacuated. Two robotic arms 42, 44 mounted within the implantation chamber 22 automatically load and unload wafer workpieces to and from a workpiece support assembly or structure 100. The workpiece 24 is shown in a horizontal loading position in FIG. 1. Prior to implantation, the workpiece support structure 100 rotates the workpiece 24 to a vertical or near vertical position for implantation. If the workpiece 24 is vertical, that is, normal with respect to the ion beam 14, the implantation angle or angle of incidence is 0 degrees. It has been found that to minimize undesirable channeling effects, typically, a small but nonzero implantation angle is selected.

In a typical implantation operation, undoped workpieces are retrieved from a first cassette 50 by a shuttle 52 which brings a workpiece 24 to the vicinity of a robotic arm 54 which moves the workpiece to an orienter 56, where the workpiece 24 is rotated to a particular crystal orientation. The arm 54 retrieves the oriented workpiece 24 and moves it into a loading station 58 adjacent the implantation chamber 22. The loading station 58 closes, is pumped down to a desired vacuum, and then opens into the implantation chamber 22. The first robotic arm 42 within the implantation station 22 grasps the workpiece 24, brings it within the implantation chamber 22 and places it on an electrostatic clamp or chuck 202 of the workpiece support structure 100. The electrostatic clamp is part of a workpiece holder assembly 200 which, in turn, is subassembly of the workpiece support structure 100. The electrostatic clamp 202 is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion implantation of the workpiece 24, the workpiece support structure 100 returns the workpiece 24 to a horizontal position and the electrostatic clamp 202 is deenergized to release the workpiece. The second robotic arm 44 of the implantation station 20 grasps the implanted workpiece 24 and moves it from the implantation chamber 22 to an unload station 60. From the unload station 60, a robotic arm 62 moves the implanted workpiece 24 to a shuttle 64 which places the workpiece into a second cassette 66.

As is customary in the industry, when the ion beam 14 is perpendicular to the implantation surface 25 of the workpiece 24, the implantation angle, IA, is defined as zero degrees. The position of the workpiece 24 with respect to the ribbon ion beam 14a shown in FIG. 2 has an implantation angle equal to 0 degrees, that is, the implantation surface 25 of the workpiece 24 is normal to the direction of the ion beam. To minimize detrimental channeling effects often times a non-zero implantation angle may be selected for implantation of the workpiece 24.

During a production run, semiconductor wafer workpieces or flat panel workpieces are serially implanted. That is, when one workpiece's implantation is completed, the electrostatic clamp 202 is deenergized to release the workpiece and implanted workpiece is automatically removed from the implantation chamber 22 and another workpiece is positioned on a support surface or pedestal 204 (FIG. 2) of the electrostatic clamp 202 and the clamp is suitably energized to securely hold the workpiece 24 on the pedestal 204.

The workpiece support structure 100 is operated by the control electronics 26. The workpiece support structure 100 supports the workpiece 24 during implantation, and, advantageously, permits:

1) rotational movement of the workpiece 24 about an axis C-C (FIG. 2) that is orthogonal to a direction of the ribbon ion beam 14a within the implantation chamber 22;

2) translational or linear movement of the workpiece 24 in a direction transverse to the ribbon ion beam 14a within the implantation chamber 22 along a path of travel parallel to a desired implantation angle; and 3) rotational movement of the workpiece 24 along an axis D-D (FIG. 2), where axis D-D is an axis of rotation of the electrostatic chuck pedestal 204 that the workpiece 24 is mounted to for implantation and is orthogonal to the rotational axis C-C.

Additionally, by virtue of its rotational capability about axis C-C, the workpiece support structure 100 advantageously permits selection of a desired implantation angle or angle of incidence between the ion beam 14 and the implantation surface 25 of the workpiece 24.

Figure 2:
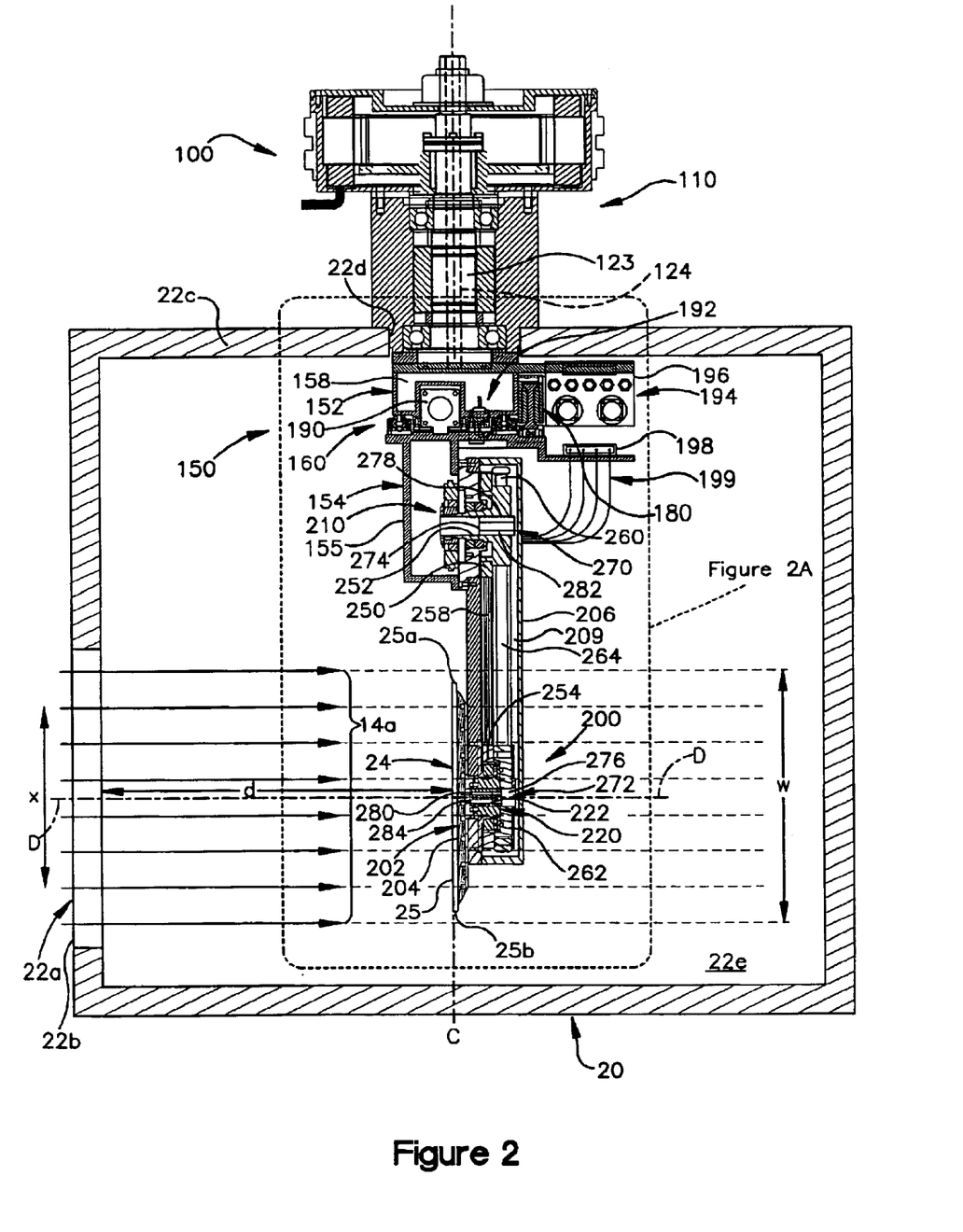
FIG. 2 is a schematic top sectional view of an implantation chamber and a first preferred embodiment of a workpiece support structure of the ion beam implanter of FIG. 1 with the wafer support structure in wafer support position.

By virtue of its translational or linear movement capability, the workpiece support structure 100 permits the implantation surface of the workpiece 24 to be moved along a plane coincident with the desired implantation angle during implantation thereby both maintaining the desired implantation angle and additionally keeping substantially constant a distance d (FIG. 2) that the ribbon ion beam 14a travels from its entry into the implantation chamber interior region 22e to the point (actually a line because the ion beam is a ribbon ion beam) where it impacts the implantation surface 25 of the workpiece 24. This substantially constant distance is maintained during the entire implantation of the implantation surface 25. That is, the substantially constant distance is maintained as the workpiece 25 moves transversely with respect to the ribbon ion beam 14a, in a plane coincident with the desired implantation angle (IA) such that the entire implantation surface is implanted from one end 25a of the implantation surface 25 to the opposite end 25b (FIG. 2). The maintenance of a substantially constant distance or path of travel for the ion beam 14a between the implantation chamber 22 and the impact of the ion beam 14a on the workpiece 24 is highly desirable for uniform ion implantation characteristics over the entire implantation surface 25 of the workpiece 24. Another way of looking at the workpiece support structure 100 is that it permits a substantially constant path of travel of the ion beam 14 from the ion source 12 to the point where it impacts the workpiece implantation surface 25.

Finally, by virtue of the rotational of the workpiece 24 about the axis D-D and the axis C-C, quad implantation of the workpiece 24 is facilitated (as well as any other implantation schemes that require successive implantations of the workpiece as different implantation angles).

First Preferred Embodiment

Figure 3:
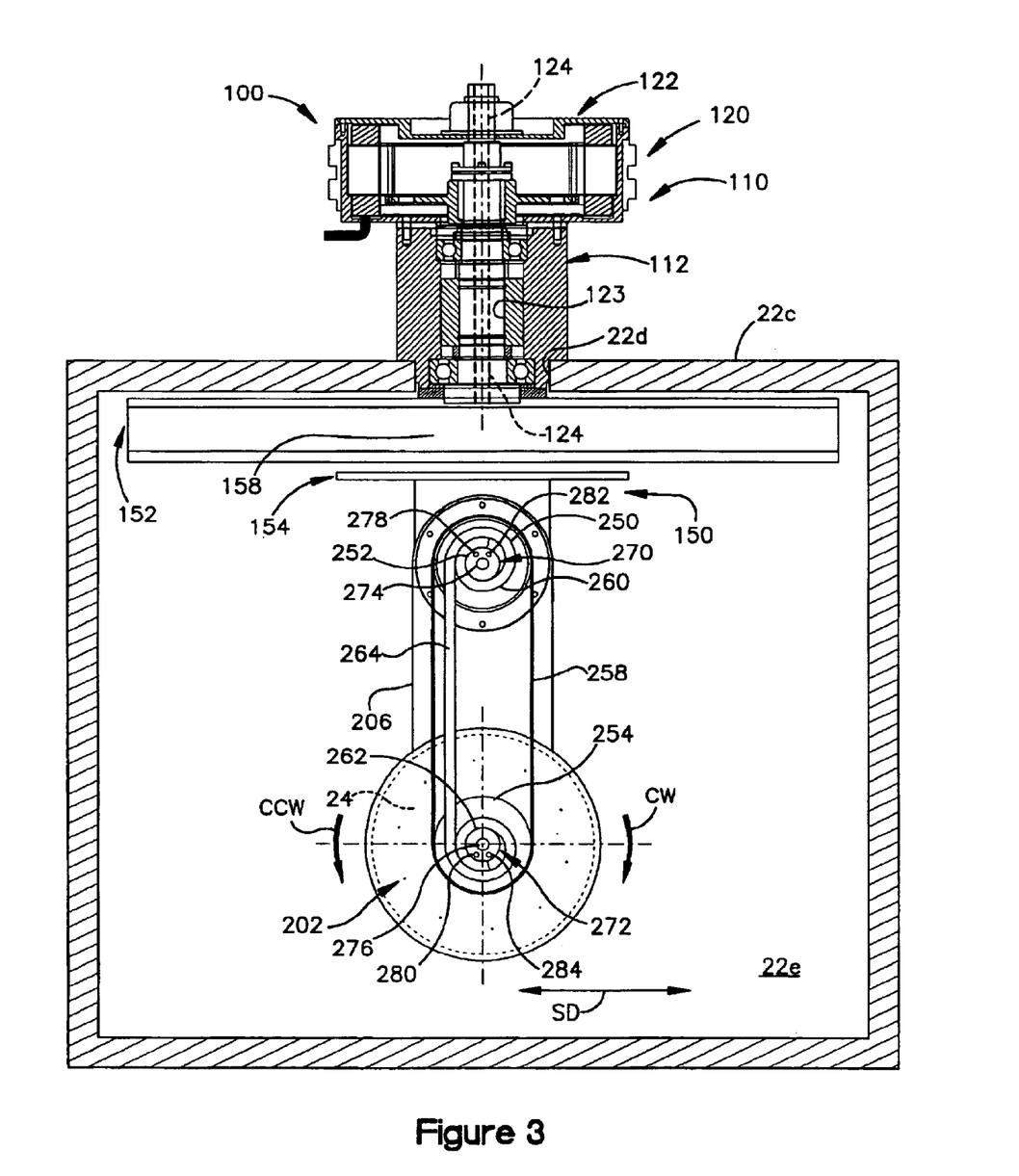
FIG. 3 is schematic front sectional view of the implantation chamber and workpiece support structure of FIG. 2 with the workpiece support structure in an implantation position.
Figure 4:
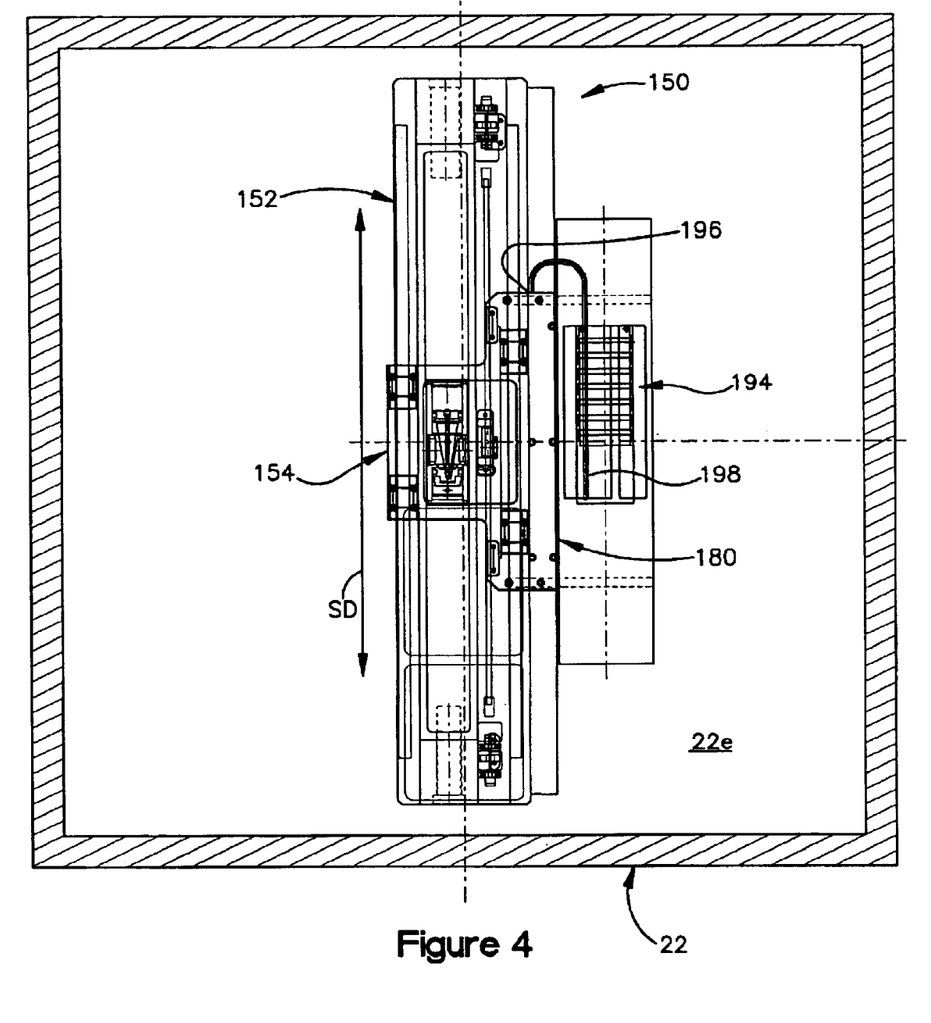
FIG. 4 is a schematic side elevation view a translation member of the workpiece support structure of FIG. 2 with the workpiece holder assembly removed.

A first preferred embodiment of the workpiece support structure 100 of the present invention is best shown in FIGS. 2–4. FIG. 1 is a top plan view showing the electrostatic clamp 202 in the workpiece loading and unloading position. After a workpiece 24 is loaded on the pedestal 204 of the electrostatic claim 202 and the electrostatic clamp is energized to secure the workpiece 24 to the pedestal 204, the workpiece support structure 100 rotates the workpiece about axis C-C to an implantation position, such as the position shown in FIG. 2 (implantation angle=0 degrees). FIG. 2 is a top plan view showing the electrostatic clamp 202 supporting the workpiece 24 in an implantation position. FIG. 1 shows the workpiece 24 in the implantation position in dashed line.

During implantation of the workpiece 24, the workpiece support structure 100 moves the workpiece 24 in a direction transverse to the ribbon ion beam 14a such that the entire implantation surface 25 is appropriately impacted and implanted with desired ions. As can be seen in the schematic depiction in FIG. 2, the ribbon ion beam 14a at a point of impact with the workpiece 24 has a width W in the horizontal or "x" direction which is greater than the diameter of the workpiece 24, thus, no translation of the workpiece in the "x" direction is required for full implantation of the workpiece.

As can best be seen in FIGS. 2 and 3, the workpiece support structure 100 is affixed to a side wall 22c of the implantation chamber 22 and extending into the interior region 22e of the implantation chamber 22 through an opening 22d in the implantation chamber side wall 22c. The workpiece support structure 100 includes a rotation member 110 and an integral translation member 150.

Specific details of the rotation member 110 and the translation member 150 are set forth in U.S. patent application Ser. No. 10/371,606, filed on Feb. 21, 2003 and assigned to the assignee of the present invention. The '606 application is incorporated herein in its entirety by reference. The rotation member 110 rotates the workpiece 24 about the tilt axis C-C (FIG. 2). The translation member 150 provides for linear translation al movement of the workpiece 24 along a plane coincident with the selected implantation angle.

The translation member 150 includes a carriage 154 which moves in a reciprocating linear motion during implantation. A path of travel of the carriage 154 is perpendicular to a normal vector of the workpiece implantation surface 25. Stated another way, linear movement of the carriage 154 causes movement of the workpiece 24 within a plane coincident with the selected implantation angle. Multiple independent degrees of freedom or motion are advantageously achieved by combination of the reciprocating linear motion of the translation member 150 with respect to the rotation member 110. This allows for constant focal length scanning of the workpiece 24 in front of the ion beam 14. In other words, a distance from the impact point of the ion beam on the workpiece implantation surface 25 to the ion beam 14 entrance into the implantation chamber 22 is always constant for all rotation angles of the rotation member 110, that is, all implantation angles.

As can best be seen in FIGS. 2–4, the translation member 150 includes a support frame 152 affixed to a rotatable tilt axis shaft 123 of the rotation member 110. The carriage 154 is mechanically coupled to the support frame 152 via a linear bearing assembly 160 for linear movement with respect to the support frame 152. As can best be seen in FIG. 2, the carriage 154 includes a flange 155 that supports the workpiece holder assembly 200. A support or scan arm 206 is attached to the flange 155 (FIG. 2) of the carriage 154. A distal end of the scan arm 206 supports the workpiece holder assembly 200. The workpiece holder assembly 200 includes the electrostatic clamp 202 which, in turn, includes the rotatable pedestal 204. The workpiece 24 is mounted to the pedestal 204 by electrostatic attraction for movement in front of the ribbon ion beam 14a.

The carriage 154 is supported for linear movement with respect to the support frame 152 by means of the linear bearing assembly 160. Linear motion of the carriage 154 with respect to the support frame 152, the vertical or "y" direction which is labeled "SD" for "scan direction" in FIGS. 3 and 4, is achieved by a linear motor assembly including a linear servomotor 180 disposed between an inwardly facing stepped portion 182 of the carriage 154 and the support frame 152.

The translation member 150 further includes a linear brake assembly 190 (best seen in FIG. 2A) and a vacuum compatible linear readback encoder 192 both affixed to an inward facing surface 176 of the carriage 154 to facilitate precise control of the position of the carriage 154 and thereby position of the workpiece 24 with respect to the ion beam 14a. The linear brake assembly 190 comprises a movable piston assembly that can be actuated pneumatically or by means of a solenoid so that the piston contacts the support frame 152, thereby providing a means of holding the carriage 154 in a fixed position.

The translation member 150 also includes a linear motion harness system 194. One end 198 (FIGS. 2A and 4) of the harness system 194 is attached to and moves with the carriage 154 and an opposite end 196 of the harness system is stationary and attached to the support frame 152. The harness system 194 provides support for electrical and cooling lines such as linear motor power lines, linear motion commutation information lines, water and gas cooling lines, brake control lines (pneumatic or electrical), encoder readback signal information lines, electrostatic clamp control lines, workpiece rotate motor power and control signal lines and workpiece scan arm pressure communication so that an interior area 208 of the workpiece support or scan arm 206 may be maintained at atmospheric pressure.

The water and gas cooling lines of the harness system 194 provide cooling for the workpiece 24 located on the pedestal 204 of the electrostatic chuck 202 and the electromagnetic coil 184 (FIG. 2A) of the linear servomotor 180. The water and gas coolant lines include a water feed and gas feed for gas cooling. Thermal energy is generated when the wafer workpiece 24 is implanted. Gas is used to help transfer thermal energy from the workpiece 24 to the pedestal 204. The cooling gas is introduced between a back surface of workpiece 24 and the pedestal 204 to help transfer thermal energy from the workpiece 24 to the pedestal 204. The pedestal 204, in turn, includes a water manifold for routing cooling water through the pedestal 204 to remove the thermal energy transferred from the workpiece 24 to the pedestal 204.

The pedestal 204 (and, therefore, the workpiece 24) may be rotated, for example, for quad implantation, via a drive system that includes an electric drive motor 210. The drive motor 210 is mounted to the flange 155 of the carriage 154. A first or drive pulley 250 is mounted to a hollow shaft 252 of the drive motor 210. A second or driven pulley 254 is mounted to a hollow shaft 222 of a combination vacuum seal/bearing assembly 220 (described below).

A drive belt 258 extending between the drive and driven pulleys 250, 254 drives the driven pulley 254 and thereby rotates the pedestal 204. Preferably, the drive belt 258 is a polymer encapsulated steel cable and the pulleys 250, 254 have a 1:1 drive ratio. The rotational centerline of the electrostatic clamp 202, shown as dashed line D-D in FIG. 2, is aligned with a centerline of the workpiece 24.

Figure 2A:
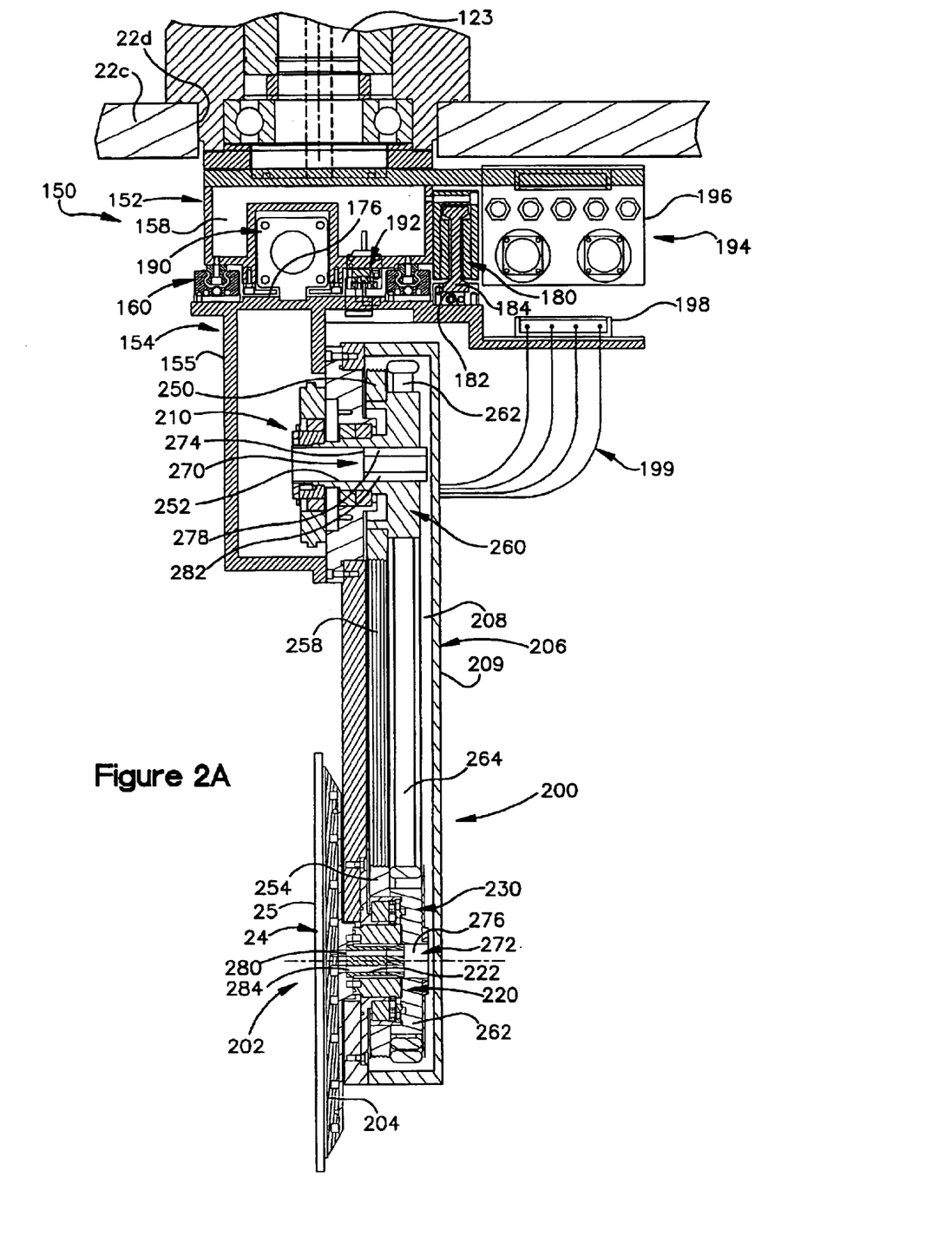
FIG. 2A is a schematic top sectional view of a portion of the workpiece support structure of FIG. 2 encircled with a dashed line and labeled FIG. 2A.

As can best be seen in FIG. 2A, a first hollow reel 260 is mounted to and rotates with the drive pulley 250 and a second hollow reel 262 is mounted to and rotates with the driven pulley 254. Extending between the first and second reels 260, 262 is a generally rectangular, hollow, facilities-carrying cord or cable 264. The hollow facilities-carrying cord or "umbilical cord" 264 is used for routing facilities through the hollow interior of the cord 264. The first and second reel 260, 262 include respective first and second connector assemblies 270, 272 which are coupled to the ends of the umbilical cord 264 to provide for fixed connections between the pedestal 204, which is at vacuum in the implantation chamber 22, and sources of the facilities outside of the implantation chamber, which are at atmospheric pressure. The connector assemblies 270, 272 include first and second electrical connectors 274, 276, first and second cooling fluid connectors 278, 280 and first and second gas cooling fluid connectors 282, 284.

The first and second electrical connectors 274, 276 are preferably circular type multipin connectors. Suitable connectors include the E Series multipin connectors sold by LEMO USA, Inc., Rohnert Park, Calif. 94927-2408 (website www.lemo.com). The first electrical connector 274 is attached to the electrical conductors exiting the umbilical cord near the end of the umbilical cord 264 attached to the first reel 260. The first connector 274 fits down into the hollow shaft of the first reel 260. The second electrical connector 276 is attached to the electrical conductors exiting the umbilical cord near the end of the umbilical cord 264 attached to the second reel 260. The second connector 276 fits down into the hollow shaft 222 of the combination vacuum seal/bearing assembly 220.

The first and second cooling fluid connectors 278, 280 and the first and second gas cooling connectors 282, 284 include barb fittings that couple to the respective ends of the fluid carrying tubes that extend through the umbilical cord 264. The barb fittings each include a threaded stud at its distal end. The threaded studs are threaded into respective threaded apertures drilled into the shaft 252 of the drive motor 210 and the shaft 222 of the combination vacuum seal/bearing assembly 220. The threaded apertures, which route the respective fluids, are parallel to the respective axes of rotation of the first and second reels 260, 262. Suitable tubing connectors may be obtained from Beswick Engineering Co., Inc., Greenland, N.H. 03840-2442 (website.www.beswick.com). Advantageously, the umbilical cord 264 is extremely durable and can withstanding many cycles of wrapping and unwrapping without cracking or failure. A suitable umbilical cord is available from W. L. Gore & Associates, Inc., 555 Papermill Road, Newark, Del. 19711, (website: www.goreelectronics.com/products/bulk_cable).

As noted above, the harness system 194 includes a fixed end 196 coupled to the support frame 152 and a moving end 198 affixed to the carriage 154. The electrical conductors and cooling lines (not shown) of the harness system 194 coupled to the fixed end 198 of the harness system pass through vacuum feedthroughs to an interior region 158 (FIG. 2A) of the support frame 152 that is at atmospheric pressure and subsequently through the central bore 124 (shown in dashed line in FIGS. 2 and 3) of the tilt axis shaft 123.

The harness system 194 further includes electrical conductors and fluid lines (shown schematically at 199 in FIGS. 2 and 2A) extending from the moving end 198 of the harness system 194 and extend through vacuum feedthroughs (not shown) in a side wall 209 of the scan arm 206 and into the scan arm interior region 208. These harness system connections are coupled to the fluid and electrical connectors of the first connector assembly 270.

The facilities that extend to the electrostatic clamp 202 are routed through the harness system 294, then through the first connector assembly 270, then through umbilical cord 264 and finally through the second connector assembly 272 to the electrostatic clamp 202. These facilities include water cooling lines for heat removal, gas cooling feed tubes for transferring heat from the workpiece, electrical power for the electrostatic chuck, electrical signal conductors for sensing the workpiece on the electrostatic chuck and a ground conductor to electrically ground the pedestal. Therefore, extending through the hollow interior of the cord 264 are coolant lines, an electrical power cable for electrical power to energize the pedestal so to create the necessary electrostatic attraction to secure the workpiece 24 to the pedestal 204, and an electrical control lines for routing encoder and control signals from the pedestal to the control electronics 26 so, for example, the exact rotational position of the pedestal 204 can be ascertained and controlled.

In one preferred embodiment of the present invention, the pulleys 250, 254 and, therefore, the first and second hollow reels 260, 262, are permitted to rotate +/−270°, which is required for quad implantation. However, it should be appreciated that depending on the length of the umbilical cord 264 rotation greater than 270°is certainly possible and contemplated by the present invention. The dual reel embodiment advantageously provides for simultaneous "reel-to-reel" wrapping and unwrapping of the umbilical cord 264, that is, if the drive motor 210 is actuated by the control electronics 26 to rotate the pedestal 204 in, for example, 90° in a clockwise direction (labeled CW in FIG. 3), the second reel 262, which is affixed to the driven pulley 254. and the first reel 260, which is affixed to the drive pulley 250 both rotate in the clockwise direction. As is clear from FIG. 3, as the first and second reels 260, 262 both rotate in the clockwise direction this causes an additional length of the cord 264 to be wrapped around the first reel 260 and unwraps the same length of the cord 264 from the second reel 262. Similarly, if the drive motor 210 is actuated by the control electronics 26 to rotate the pedestal 204 90° in the counterclockwise direction (labeled CCW in FIG. 3), the first and second reels 260, 262 rotate in the counterclockwise direction causing an additional length of the cord 264 to be wrapped around the second reel 262 and unwrapping the same length of cord 264 for the first reel 260.

Advantageously, since the interior region 208 of the scan arm 206 is at atmospheric pressure, the drive motor 210 of the workpiece holder assembly 200 which rotates the electrostatic clamp 202 and the workpiece 24 disposed thereon for quad or octal implants, the direct drive motor does not require cooling water. Additionally, since the drive motor 210 is at atmospheric pressure, a standard brushless type servomotor and a standard encoder may be used.

The pedestal 204 is mounted to the scan arm 206 by means of the combination vacuum seal/bearing assembly 220. Preferably, the vacuum seal/bearing assembly 220 is a hollow shaft ferrofluidic seal and bearing assembly. The assembly 220 includes both a bearing assembly to permit rotation of the pedestal 204 and a ferrofluidic vacuum seal between the interior region 208 (FIGS. 2 and 2A) of the workpiece support assembly scan arm 206, which is at atmospheric pressure, and the pedestal 204, which is at vacuum in the implantation chamber interior region 22e. The pedestal 204 is affixed to the rotatable hollow shaft 221 of the vacuum seal/bearing assembly 220.

A suitable hollow shaft ferrofluidic seal assembly is available from Rigaku International Corp./MSC, Toyko Japan (website www.rigaku.com/vacuum). An explanation of a ferrofluidic vacuum seal/bearing assembly is set forth an article entitled "Theory of Vacuum Products" located on the Rigaku/MSC web site (http://www.msc.com/vacuum/about_tech.html) which is incorporated herein by reference. A ferrofluidic vacuum seal assembly is also disclosed in application Ser. No. 10/371,066, referenced above and incorporated herein by reference.

In essence, the ferrofluidic vacuum seal/bearing assembly 220 includes a bearing assembly rotatably supporting the hollow feedthrough shaft 222. The assembly 220 further includes a ferrofluidic vacuum seal assembly which includes a housing supporting a ring-shaped permanent magnet, two ring-shaped pole pieces disposed on either side of the permanent magnet, and ferrofluid disposed in the respective radial gaps between the axial, inward facing surface of the pole pieces and the hollow shaft 222. The ferrofluid is a colloidal suspension of ultramicroscopic magnetic particles in a carrier liquid and is located in axial grooves machined into either the pole pieces or the hollow shaft 222. For the vacuum seal/bearing assembly 220 to properly work, the hollow shaft 222 must be magnetically permeable.

In the ferrofluidic vacuum seal/bearing assembly 220, a magnetic circuit is completed by the stationary pole pieces and the shaft 222. The magnetic circuit concentrates magnetic flux in the radial gap between each pole piece and the shaft 222. The ferrofluid in the respective radial gaps assumes the shape of a liquid O-ring and produces a hermetic seal between the ring-shaped pole pieces and the shaft 222. If necessary, multiple stages of ring-shaped permanent magnets and ring-shaped pole pieces may be used to increase the pressure capacity of the vacuum seal/bearing assembly 220.

The ferrofluidic seal of the vacuum seal/bearing assembly 220 provides a hermetic seal under both static and dynamic conditions against gas, vapor and other contaminants. Further, since the sealing medium is a fluid, there is virtually no friction between the hollow shaft 221 and the stationary portions of the seal assembly 220. A magnetic fluid seal system is disclosed in U.S. Pat. No. 4,293,137, issued Oct. 6, 1981 to Ezekiel. The '137 patent is incorporated in its entirety herein by reference.

Alternately, the vacuum seal/bearing assembly 220 may be comprised of separate vacuum seal and bearing assemblies. For example, a differentially pumped, contact-type vacuum seal system may be used to maintain the vacuum or other suitable seal systems know to those of skill in the art. A description of a differentially pumped, contact-type vacuum-type vacuum seal system is found in U.S. patent application Ser. No. 10/192,344, filed on Jul. 10, 2002 and assigned to the assignee of the present invention. The '344 application is incorporated herein in its entirety by reference.

Similarly, a separate bearing assembly may be a ball or roller bearing assembly, having ball or roller bearings supported within a bearing cage and disposed between and arcuate inner and outer races affixed to or formed in the corresponding surfaces of the shaft 222 supporting the pedestal 204 and the scan arm 206. Alternately, the bearing assembly may be a non-contact gas bearing.

The reel-to-reel umbilical cord system permits the position of the pedestal drive motor 210 to be offset from the pedestal 204. This, together with the flat, hollow vacuum seal system 220, results in a low "stack height" for the workpiece holder assembly 200 compared to a slip ring/sliding seal arrangement. Because of the reduced "stack height," the stand-alone dosimetry system 40 that monitors the ion beam 14a may be positioned in close proximity to the workpiece 24 for more accurate measurements by the system 40.

Additionally, the offset position of the pedestal drive motor 210 also provides for the application of less torque on the carriage 154 and scan arm 206 because of a decreased moment arm. This permits the scan arm 206 to be manufactured of lower strength or thinner materials.

Second Preferred Embodiment

Figure 5:
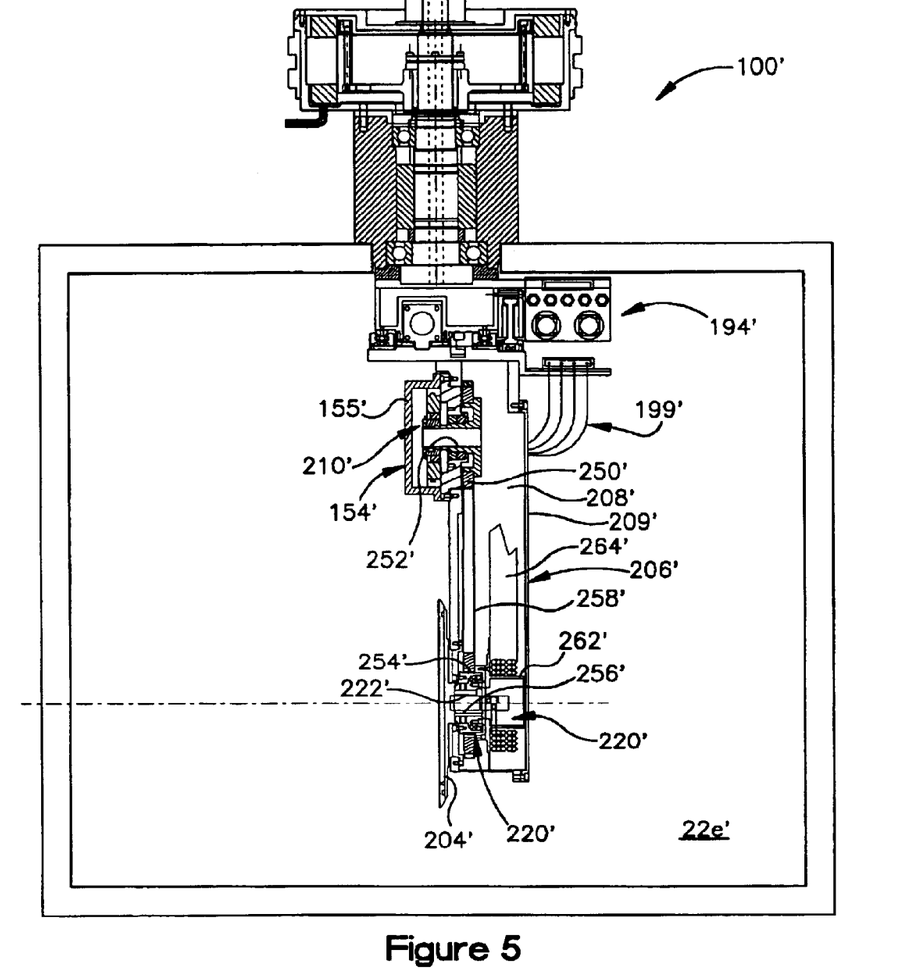
FIG. 5 is a schematic top plan view of a second preferred embodiment of the workpiece support structure of the present invention.
Figure 6:
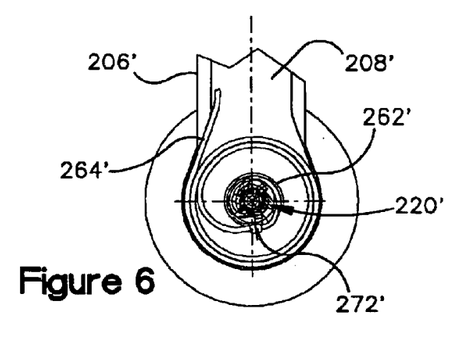
FIG. 6 is a schematic side elevation view of a reel and facilities cord of the workpiece support structure of FIG. 5 with the cord in a fully unwrapped position.
Figure 7:
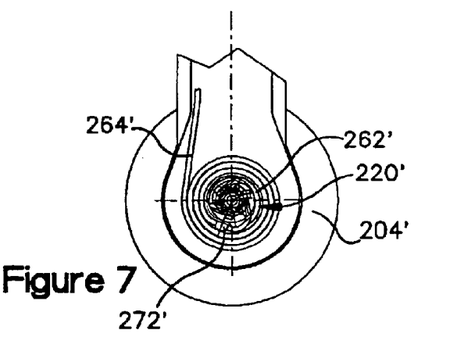
FIG. 7 is a schematic side elevation view of a reel and facilities cord of the workpiece support structure of FIG. 5 with the cord in a fully wrapped position.

A second preferred embodiment of the workpiece support structure of the present invention is shown in FIGS. 5–7. Except for the features discussed below the workpiece support structure 100' of the second preferred embodiment is identical in structure and function to the workpiece support structure 100 of the first embodiment.

In the second embodiment, the workpiece support structure 100' includes a single reel 262', similar to the reel 262 of the first embodiment. No second reel is used. A generally rectangular shaped, facilities-carrying, hollow cord or umbilical cord 264' is coupled to and wrapped about the reel 262', which, in turn, is coupled to a rotatable pedestal 204'.

A drive system is used, as in the first embodiment, to rotate the pedestal 204' and concurrently play the umbilical cord 264' onto and off from the single reel 262'. The drive system includes a drive motor 210', remote from the pedestal 204', mounted to a flange 155' of a carriage 154' of the workpiece support structure 100'. A first or drive pulley 250' is mounted to a hollow shaft 252' of the drive motor 210'. A second or driven pulley 254' is mounted to a hollow shaft 222' of a combination vacuum seal/bearing assembly 220'.

A drive belt 258' extending between the drive and driven pulleys 250', 254' drives the driven pulley 254' and thereby rotates the pedestal 204'. The single reel 262' is affixed to a driven pulley 254', similar to the driven pulley 254 of the first embodiment. A portion of a facilities routing umbilical cord 264', similar to the umbilical cord 264' of the first embodiment, is wrapped around the reel 262'. An end of the umbilical cord 264' is attached to the reel 262' while an opposite end of the umbilical cord 264' is coupled to and terminates at an opening in a side wall 209' of the scan arm 206'. The facilities carried by the umbilical cord 264' exit the umbilical cord 264' near the end of the umbilical cord coupled to scan arm side wall 209'. Facilities fluid lines and electrical conductors 199' extending from the moving end 198 of the harness system 194 extend through hermetic feedthroughs through the side wall 209' of the scan arm 206' and are coupled to the electrical conductors and fluid lines routed through the umbilical cord 264' via a fluid and electrical connector assembly 272' coupled to the reel 262'.

FIG. 7 shows the umbilical cord 264' in a wrapped position about the reel 262', while FIG. 6 shows the umbilical cord 264' in an unwrapped position about the reel 262'. As is clear from FIGS. 6 and 7, a length of the cord 264' wrapped around the reel 262' decreases as the motor 210' rotates the driven pulley 254' and the pedestal 204' and plays the umbilical cord 264' off the reel 262'. As can be seen in FIG. 6, the umbilical cord 264' has multiple layers or turns around a periphery of the reel 262'. Multiple turns of the umbilical cord 264' tends to spread out the stress on the cord 264' that results from starting and stopping rotation of the reel 262. However, the present invention can be practiced with or without multiple turns of the cord about the reel.

Electrical conductors and cooling lines that are routed through the hollow center of the umbilical cord 264' are coupled at one end to the fluid and electrical connector assembly 272' coupled to the reel 262' (as described in the first embodiment with respect to the second reel 262 of the first embodiment). As noted above, the other end of the umbilical cord 264' is attached to the scan arm side wall 209'.

The pedestal 204' is mounted to the scan arm 206' by means of the combination vacuum seal/bearing assembly 220'. The vacuum seal/bearing assembly 220', like the ferrofluidic vacuum seal/bearing assembly 220 of the first embodiment, includes a housing that supports spaced apart bearings, a rotatable hollow shaft supported by the bearings, and a ferrofluidic seal between the housing and the shaft. The vacuum seal/bearing assembly 220' is needed because, as in the first embodiment, the interior region 208' of the workpiece support assembly scan arm 206' is at atmospheric pressure, while the pedestal 204' is at vacuum in the implantation chamber interior region 22e'.

The position of the pedestal drive motor 210' offset from the pedestal 204' and the flat, hollow vacuum seal/bearing system 220' provide for a low "stack height" for the workpiece holder assembly 200' and therefore have the same advantages discussed in the first embodiment regarding low "stack height." Additionally, as in the first embodiment, the offset position of the pedestal drive motor 210' also provides for the application of less torque on the carriage 154' and scan arm 206' because of a decreased moment arm and, therefore, permits the scan arm 206' to be of thinner construction.

Third Preferred Embodiment

Figure 8:
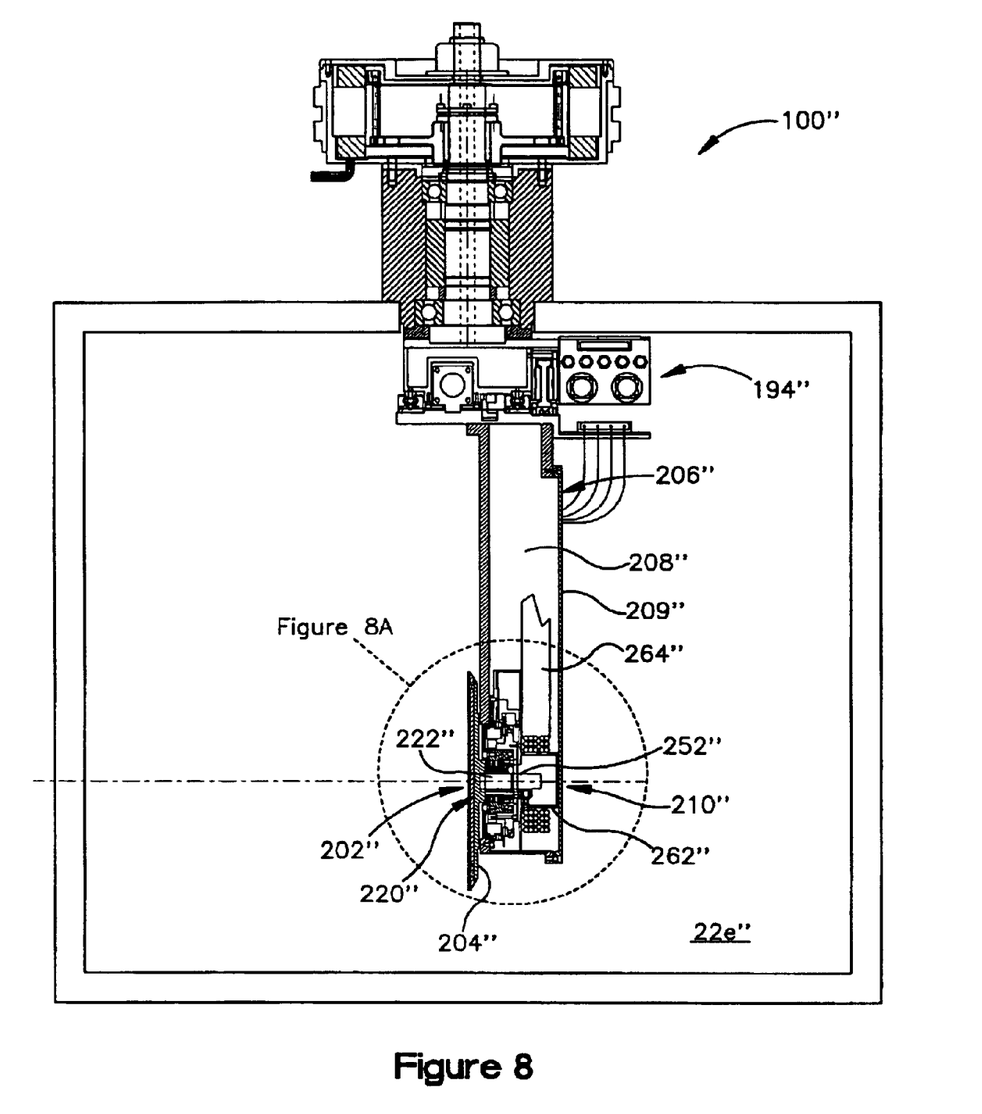
FIG. 8 is a schematic top sectional view of a third preferred embodiment of the workpiece support structure of the present invention.
Figure 8A:
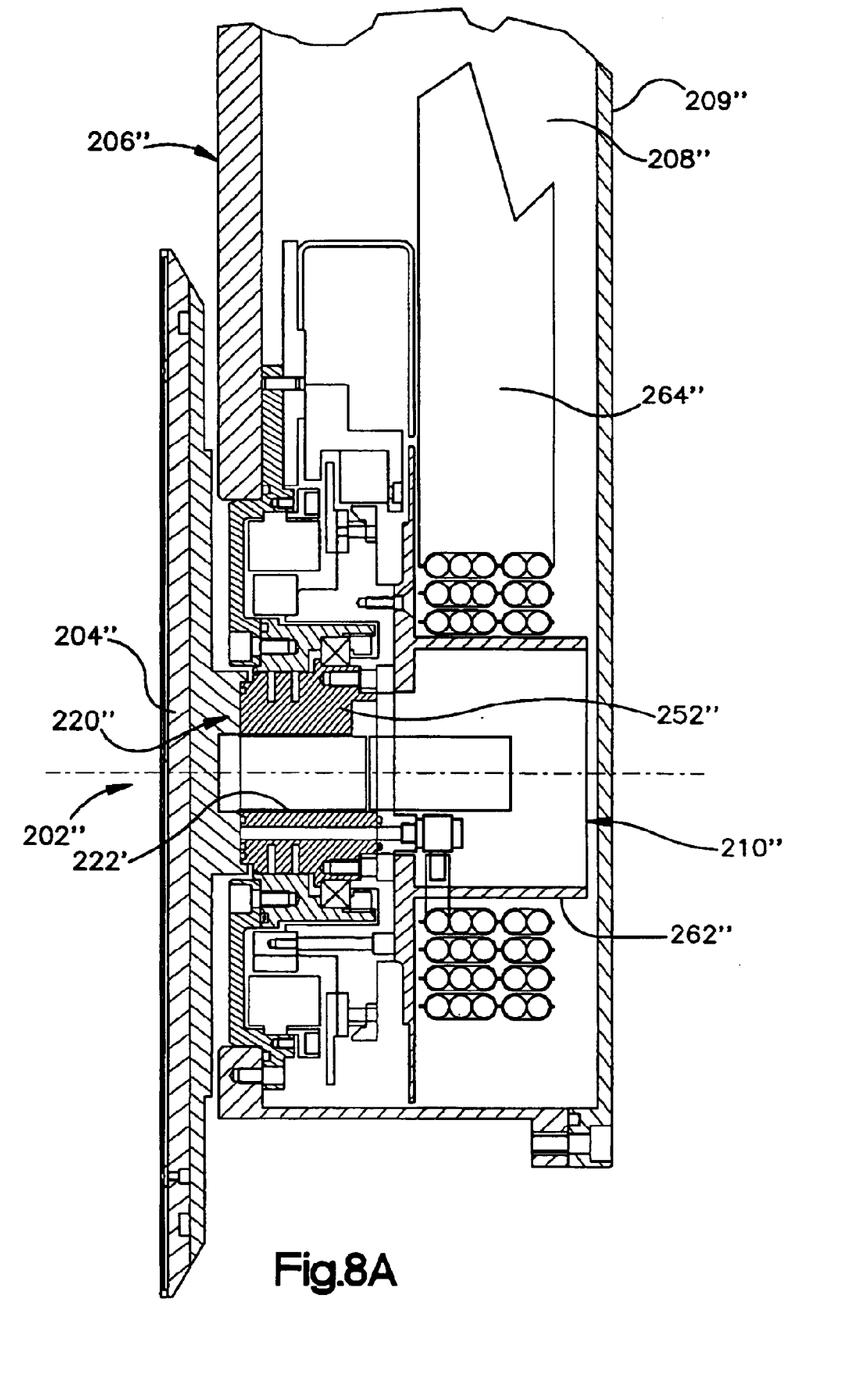
FIG. 8A is a schematic top sectional view of a portion of the workpiece support structure of FIG. 8 encircled with a dashed line and labeled FIG. 8A.

A third preferred embodiment of the workpiece support structure of the present invention is shown in FIGS. 8 and 8A. Except for the features discussed below the workpiece support structure 100" of the third preferred embodiment is identical in structure and function to the workpiece support structure 100' of the second embodiment.

In the third embodiment, the workpiece support structure 100" is identical to the second embodiment except that instead of using a drive system that includes an electric drive motor 210' that is remote from the pedestal 204' and the single reel 262', the third embodiment uses a direct drive motor 210" mounted to a distal end portion of the scan arm 206". The direct drive motor 210" rotatably drives a hollow feedthrough shaft 222" of a vacuum seal/bearing assembly 220'. The shaft 222" is coupled to the pedestal 204" and the reel 262" to simultaneously rotate the pedestal 204" and the reel 262".

As in the second embodiment, as the pedestal 204" is rotated, the hollow, facilities-carrying umbilical cord 264" is played out from or played onto the reel 262". An end of the umbilical cord 264" is coupled to the reel 262" while an opposite end of the umbilical cord is coupled to a side wall 209" of the scan arm 206", as was the case in the second embodiment.

As with the second embodiment, electrical conductors and cooling lines that are routed through the hollow center of the umbilical cord 264".

The combination vacuum seal/bearing assembly 220" is preferably a flat, hollow ferrofluidic vacuum seal/bearing assembly, like the vacuum seal/bearing assembly 220' of the second embodiment. The assembly 220" is disposed between the pedestal 204" and the workpiece support assembly scan arm 206'. The vacuum seal/bearing assembly 220" is needed because, as in the first and second embodiments, the interior region 208" of the scan arm 206" is at atmospheric pressure, while the pedestal 204" is at vacuum in the implantation chamber interior region 22e".

The ferrofluidic vacuum seal/bearing assembly 220" provides for a low "stack height" for the workpiece holder assembly 200". While the presence of the drive motor at the distal end of the scan arm does increase the "stack height" somewhat and adds to the torque applied to the scan arm, the advantage of the direct drive motor is that the drive system is simplified, obviating the need for a drive pulley, a driven pulley and a drive belt.

While the present invention has been described with a degree of particularity, it is the intent that the invention include all modifications and alterations from the disclosed design falling with the spirit or scope of the appended claims.

We claim:

1. An ion beam implanter comprising:
    a) an ion beam source for generating an ion beam moving along a beam line;
    b) an implantation chamber having an evacuated interior region wherein a workpiece is positioned to intersect the ion beam for ion implantation of an implantation surface of the workpiece by the ion beam; and
    c) workpiece support structure coupled to the implantation chamber and supporting the workpiece, the workpiece support structure including:
        1) a chuck for holding the workpiece, the chuck including a rotatable pedestal supporting the workpiece;
        2) a first rotatable reel coupled to and rotatable with the pedestal;
        3) a flexible, hollow cord coupled to the first rotatable reel such that, as the pedestal is rotated in a first direction, a length of the flexible cord wrapped around the first reel increases and, as the pedestal is rotated in an opposite direction, a length of the flexible cord wrapped around the first reel decreases; and
        4) facilities including at least one of a coolant line carrying coolant to the chuck and an electrical power conductor conducting electrical power or control signals to the chuck, at least a portion of the at least one of the coolant line and the electrical power conductor being routed through an interior of the cord.

2. The ion beam implanter of claim 1 wherein the workpiece support structure further includes a drive including a rotatable member operatively coupled to the chuck for rotating the pedestal.

3. The ion beam implanter of claim 2 wherein the workpiece support structure further includes a second rotatable reel coupled to and rotatable with the rotatable member of the drive, the cord extending between the first and second rotatable reels and coupled to the second rotatable reel such that, as the pedestal is rotated in the first direction, a length of the flexible cord wrapped around the second reel increases and, as the pedestal is rotated in the opposite direction, a length of the flexible cord wrapped around the second reel decreases.

4. The ion beam implanter of claim 3 wherein the rotatable member of the drive includes a drive pulley and the chuck includes a driven pulley coupled to the pedestal and a drive belt extends between the drive and driven pulleys to rotate the pedestal when the drive rotates the drive pulley.

5. The ion beam implanter of claim 4 wherein the first reel is coupled to the driven pulley and the second reel is coupled to the drive pulley.

6. The ion beam implanter of claim 1 wherein the facilities include both the coolant line carrying coolant to the chuck and the electrical power conductor conducting electrical power or control signals to the chuck and further including a first connector assembly near an end of the cord attached to the first reel, the first connector assembly including a first fluid connector to which the coolant line is coupled to permit fluid flow to the chuck and a first electrical connector to which the electrical power conductor is coupled to permit conduction of electrical power or control signals to the chuck.

7. The ion beam implanter of claim 3 wherein the facilities include both the coolant line carrying coolant to the chuck and the electrical power conductor conducting electrical power to the chuck and further including a second connector assembly near an end of the cord attached to the second reel, the second connector assembly including a first fluid connector to which the coolant line is coupled to permit fluid flow to the chuck and a first electrical connector to which the electrical power conductor is coupled to permit conduction of electrical power or control signals to the chuck.

8. The ion beam implanter of claim 6 wherein the coolant line includes a first fluid coolant line for routing cooling fluid to the chuck and a second gas coolant line for routing heat transfer gas to the chuck and the first connector assembly includes first and second fluid.

9. The ion beam implanter of claim 4 wherein the workpiece support structure includes a scan arm that supports the chuck, the scan arm defining an interior region at atmospheric pressure, the first and second rotatable reels, the cord and the drive and driven pulleys are disposed within the scan arm interior region.

10. The ion beam implanter of claim 4 wherein a hollow vacuum seal is disposed between the driven pulley and the chuck to provide a seal between the ion implantation chamber interior region and the scan arm interior region, the vacuum seal defining a central opening through which a portion of the facilities are routed to the chuck.

11. The ion beam implanter of claim 1 wherein the chuck is an electrostatic chuck and the workpiece is held on the pedestal by electrostatic force.

12. The ion beam implanter of claim 1 wherein the workpiece support structure includes a rotation member coupled to the implantation chamber for changing an implantation angle of the workpiece with respect to a portion of the ion beam within the implantation chamber and a translation member disposed within the implantation chamber and movably coupled to the rotation member, the translation member supporting the chuck and the workpiece for movement along a linear path of travel.

13. An ion beam implanter comprising:
a) an ion beam source for generating an ion beam moving along a beam line;
b) an implantation chamber having an evacuated interior region wherein a workpiece is positioned to intersect the ion beam for ion implantation of an implantation surface of the workpiece by the ion beam; and
c) workpiece support structure coupled to the implantation chamber and supporting the workpiece, the workpiece support structure including:
1) a chuck for holding the workpiece, the chuck including a rotatable pedestal supporting the workpiece;
2) a drive including a rotatable member operatively coupled to the chuck for rotating the pedestal;
3) a first rotatable reel coupled to and rotatable with the pedestal;
4) a second rotatable reel coupled to and rotatable with the rotatable member of the drive;
5) a flexible, hollow cord extending between and coupled to the first and second rotatable reels such that, as the pedestal is rotated in a first direction, a length of the flexible cord wrapped around the first reel increases and a length of the flexible cord wrapped around the second reel decreases and, as the pedestal is rotated in an opposite direction, a length of the flexible cord wrapped around the first reel decreases and a length of the flexible cord wrapped around the second reel increases; and
6) facilities including at least one of a coolant line carrying coolant to the chuck and an electrical power conductor conducting electrical power to the chuck, at least a portion of the at least one of the coolant line and the electrical power conductor being routed through an interior of the cord.

14. A workpiece support assembly for an ion beam implanter generating an ion beam moving along a beam line and including an implantation chamber wherein a workpiece is positioned to intersect the ion beam for ion implantation of an implantation surface of the workpiece by the ion beam, the workpiece support assembly comprising:
a) a chuck for holding the workpiece, the chuck including a rotatable pedestal supporting the workpiece;
b) a first rotatable reel coupled to and rotatable with the pedestal;
c) a flexible, hollow cord coupled to the first rotatable reel such that, as the pedestal is rotated in a first direction, a length of the flexible cord wrapped around the first reel increases and, as the pedestal is rotated in an opposite direction, a length of the flexible cord wrapped around the first reel decreases; and
d) facilities including at least one of a coolant line carrying coolant to the chuck and an electrical power conductor conducting electrical power to the chuck, at least a portion of the at least one of the coolant line and the electrical power conductor being routed through the cord.

15. The workpiece support assembly of claim 14 further including a drive including a rotatable member operatively coupled to the chuck for rotating the pedestal.

16. The workpiece support assembly of claim 15 further including a second rotatable reel coupled to and rotatable with the rotatable member of the drive, the cord extending between the first and second rotatable reels and coupled to the second rotatable reel such that, as the pedestal is rotated in the first direction, a length of the flexible cord wrapped around the second reel increases and, as the pedestal is rotated in the opposite direction, a length of the flexible cord wrapped around the second reel decreases.

17. The workpiece support assembly of claim 16 wherein the rotatable member of the drive includes a drive pulley and the chuck includes a driven pulley coupled to the pedestal and a drive belt extends between the drive and driven pulleys to rotate the pedestal when the drive rotates the drive pulley.

18. The workpiece support assembly of claim 17 wherein the first reel is coupled to the driven pulley and the second reel is coupled to the drive pulley.

19. The workpiece support assembly of claim 15 further including a first connector near an end of the cord attached to the first reel, the first connector providing for a fixed connection between the portion of the least one of the coolant line and the electrical power conductor routed through the cord and at least one of a section of a coolant line extending from the chuck to the first connector and a section of electrical power conductor extending from the chuck to the first connector.

20. The workpiece support assembly of claim 16 further including a second connector near an end of the cord attached to the second reel, the second connector providing for a fixed connection between the portion of the least one of the coolant line and the electrical power conductor routed through the cord and at least one of a section of a coolant line extending from outside the implantation chamber to the second connector and a section of electrical power conductor extending from outside of the implantation chamber to the second connector.

21. The workpiece support assembly of claim 20 wherein the rotatable member of the drive includes a hollow shaft and the at least one of a section of a coolant line extending from outside the implantation chamber to the second connector and a section of electrical power conductor extending from outside of the implantation chamber to the second connector extends through the hollow shaft and is coupled to the second connector.

22. The workpiece support assembly of claim 17 further including a scan arm that supports the chuck, the scan arm defining an interior region at atmospheric pressure, the first and second rotatable reels, the cord and the drive and driven pulleys are disposed within the scan arm interior region.

23. The workpiece support assembly of claim 22 wherein a hollow vacuum seal is disposed between the driven pulley and the chuck to provide a seal between the ion implantation chamber interior region and the scan arm interior region, the vacuum seal defining a central opening through which a portion of the facilities are routed to the chuck.

24. The workpiece support assembly of claim 14 wherein the chuck is an electrostatic chuck and the workpiece is held on the pedestal by electrostatic force.

25. The workpiece support assembly of claim 14 further including a rotation member coupled to the implantation chamber for changing an implantation angle of the workpiece with respect to a portion of the ion beam within the implantation chamber and a translation member disposed within the implantation chamber and movably coupled to the rotation member, the translation member supporting the chuck and the workpiece for movement along a linear path of travel.

26. An ion beam implanter comprising:
a) an ion beam source for generating an ion beam moving along a beam line;
b) an implantation chamber having an evacuated interior region wherein a workpiece is positioned to intersect the ion beam for ion implantation of an implantation surface of the workpiece by the ion beam; and
c) workpiece support structure coupled to the implantation chamber and supporting the workpiece, the workpiece support structure including:
1) a chuck for holding the workpiece, the chuck including a rotatable pedestal supporting the workpiece;
2) a drive including a rotatable member operatively coupled to the chuck for rotating the pedestal;
3) a first rotatable reel coupled to and rotatable with the pedestal;
4) a flexible, hollow cord coupled to the first reel such that, as the pedestal is rotated in a first direction, a length of the flexible cord wrapped around the first reel increases and, as the pedestal is rotated in an opposite direction, a length of the flexible cord wrapped around the first reel decreases; and
5) facilities including at least one of a coolant line carrying coolant to the chuck and an electrical power conductor conducting electrical power to the chuck, at least a portion of the at least one of the coolant line and the electrical power conductor being routed through an interior of the cord.

27. The ion beam implanter of claim 26 wherein the workpiece support structure further includes a second rotatable reel coupled to and rotatable with the rotatable member of the drive, the flexible cord coupled to the second reel such that, as the pedestal is rotated in the first direction, a length of the flexible cord wrapped around the second reel decreases and, as the pedestal is rotated in the opposite direction, a length of the flexible cord wrapped around the second reel increases.

28. The ion beam implanter of claim 27 wherein rotatable member of the drive includes a drive pulley and the chuck includes a driven pulley coupled to the pedestal and a drive belt extends between the drive and driven pulleys to rotate the pedestal when the drive rotates the drive pulley.

29. A workpiece support assembly for an ion beam implanter generating an ion beam moving along a beam line and including an implantation chamber wherein a workpiece is positioned to intersect the ion beam for ion implantation of an implantation surface of the workpiece by the ion beam, the workpiece support assembly comprising:
a) a chuck for holding the workpiece, the chuck including a rotatable pedestal supporting the workpiece;
b) a drive including a rotatable member operatively coupled to the chuck for rotating the pedestal;
c) a first rotatable reel coupled to and rotatable with the pedestal;
d) a flexible, hollow cord coupled to the first reel such that, as the pedestal is rotated in a first direction, a length of the flexible cord wrapped around the first reel increases and, as the pedestal is rotated in an opposite direction, a length of the flexible cord wrapped around the first reel decreases; and
e) facilities including at least one of a coolant line carrying coolant to the chuck and an electrical power conductor conducting electrical power to the chuck, at least a portion of the at least one of the coolant line and the electrical power conductor being routed through the cord.

30. The workpiece support assembly of claim 29 further including a second rotatable reel coupled to and rotatable with the rotatable member of the drive, the flexible cord coupled to the second reel such that, as the pedestal is rotated in the first direction, a length of the flexible cord wrapped around the second reel decreases and, as the pedestal is rotated in the opposite direction, a length of the flexible cord wrapped around the second reel increases.

31. The workpiece support assembly of claim 30 wherein rotatable member of the drive includes a drive pulley and the chuck includes a driven pulley coupled to the pedestal and a drive belt extends between the drive and driven pulleys to rotate the pedestal when the drive rotates the drive pulley.

32. The ion beam implanter of claim 2 wherein the drive is a direct drive servo motor coupled to the pedestal.

33. The workpiece support assembly of claim 15 wherein the drive is a direct drive servo motor coupled to the pedestal.

* * * * *